US011616110B2

(12) United States Patent
Kokame et al.

(10) Patent No.: US 11,616,110 B2
(45) Date of Patent: *Mar. 28, 2023

(54) DISPLAY DEVICE AND ARRAY SUBSTRATE

(71) Applicant: Japan Display Inc., Minato-ku (JP)

(72) Inventors: Hiraaki Kokame, Minato-ku (JP); Akinori Kamiya, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/708,068

(22) Filed: Mar. 30, 2022

(65) Prior Publication Data

US 2022/0223676 A1     Jul. 14, 2022

Related U.S. Application Data

(63) Continuation of application No. 17/148,680, filed on Jan. 14, 2021, now Pat. No. 11,335,758, which is a (Continued)

(30) Foreign Application Priority Data

Apr. 12, 2017 (JP) .............................. JP2017-078826

(51) Int. Cl.
*H01L 27/32* (2006.01)
*G06F 3/041* (2006.01)
*H01L 51/52* (2006.01)

(52) U.S. Cl.
CPC .......... *H01L 27/3272* (2013.01); *G06F 3/041* (2013.01); *H01L 27/323* (2013.01); *H01L 51/5253* (2013.01); *G06F 2203/04107* (2013.01)

(58) Field of Classification Search
CPC .................. G06F 3/041; G06F 3/0412; G06F 2203/04107; G09F 9/30; H01L 27/32;
(Continued)

(56) References Cited

U.S. PATENT DOCUMENTS

2012/0120616 A1   5/2012   Katsui
2014/0111953 A1*  4/2014   McClure ............... G06F 3/0445
                                                    361/749
(Continued)

FOREIGN PATENT DOCUMENTS

JP     2001-185348 A     7/2001
JP     2003-099193 A     4/2003
(Continued)

OTHER PUBLICATIONS

International Search Report dated Apr. 24, 2018 in PCT/JP2018/001951 filed on Jan. 23, 2018 (w/English translation).
(Continued)

*Primary Examiner* — Nelson M Rosario
(74) *Attorney, Agent, or Firm* — Maier & Maier, PLLC

(57) ABSTRACT

A display device according to an embodiment of the present invention includes: a substrate, a plurality of pixels on the substrate, a first inorganic insulating layer that covers the plurality of pixels, a conductive layer on the first inorganic insulating layer, and a second inorganic insulating layer that on the conductive layer, the conductive layer being between the first inorganic insulating layer and the second inorganic insulating layer, wherein the first inorganic insulating layer includes an area that is in direct contact with the second inorganic insulating layer, and all of the conductive layer is covered with the first inorganic insulating layer and the second inorganic insulating layer.

20 Claims, 4 Drawing Sheets

Related U.S. Application Data continuation of application No. 16/596,883, filed on Oct. 9, 2019, now Pat. No. 11,031,451, which is a continuation of application No. PCT/JP2018/001951, filed on Jan. 23, 2018.

(58) Field of Classification Search
CPC ... H01L 27/323; H01L 27/3272; H01L 51/50; H01L 51/5253; H01L 2251/308; H01L 2251/5315; H01L 2251/5369; H05B 33/02; H05B 33/04; H05B 33/22
See application file for complete search history.

(56) References Cited

U.S. PATENT DOCUMENTS

| | | | |
|---|---|---|---|
| 2014/0152621 A1 | 6/2014 | Okayama et al. | |
| 2015/0279915 A1 | 10/2015 | Morita | |

FOREIGN PATENT DOCUMENTS

| | | |
|---|---|---|
| JP | 2005-353398 | 12/2005 |
| JP | 2006-4650 | 1/2006 |
| JP | 2008-538592 | 10/2008 |
| JP | 2011-23558 A | 2/2011 |
| JP | 2013-171454 A | 9/2013 |
| JP | 2014-052997 A | 3/2014 |
| JP | 2014-111335 A | 6/2014 |
| JP | 2014-112510 A | 6/2014 |
| JP | 2015-011761 A | 1/2015 |
| WO | WO 2013/061967 A1 | 5/2013 |

OTHER PUBLICATIONS

International Preliminary Report on Patentability and English translation of the Written Opinion of the International Searching Authority dated Oct. 15, 2019, in PCT/JP2018/001951, 14 pages.

Notice of Reasons for Refusal dated Aug. 4, 2020 in Japanese Patent Application No. 2017-078826 (w/unedited computer-generated English translation), 5 pages.

Office Action dated Jan. 5, 2021 in Japanese Application No. 2017-078826 (w/computer-generated English translation).

Combined Chinese Office Action and Search Report dated Jun. 3, 2021 in Patent Application No. 201880024831.9 (w/computer-generated English translation), 19 pages.

Combined Chinese Office Action and Search Report dated Sep. 18, 2021 in Chinese Patent Application No. 201880024831.9 (with unedited computer generated English translation), 18 pages.

\* cited by examiner

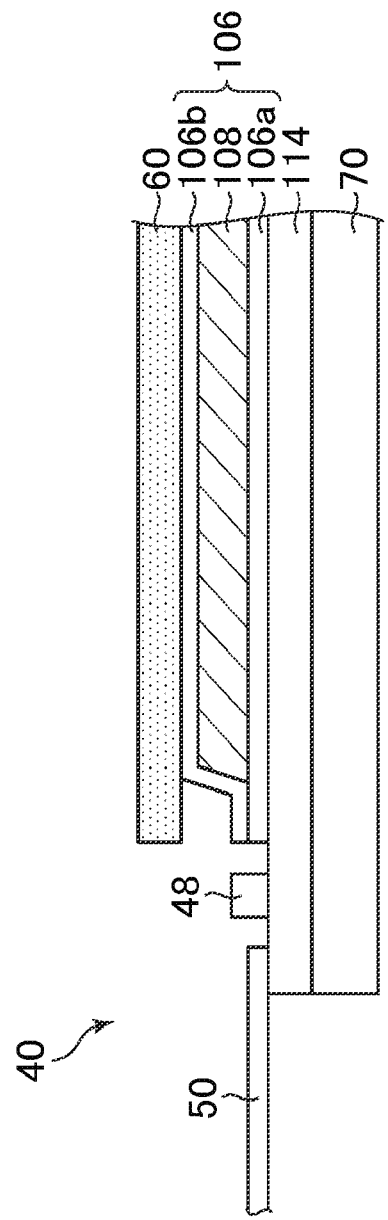

DISPLAY DEVICE AND ARRAY SUBSTRATE

CROSS-REFERENCE TO RELATED APPLICATIONS

This application is a continuation of and claims the benefit of priority under 35 U.S.C. 120 from U.S. application Ser. No. 17/148,680 filed Jan. 14, 2021, which is a continuation of U.S. application Ser. No. 16/596,883 filed Oct. 9, 2019 (now U.S. Pat. No. 11,031,451 issued Jun. 8, 2021), which is a continuation of International Application PCT/JP2018/001951 filed Jan. 23, 2018, and claims the benefit of priority under 35 U.S.C. § 119 from Japanese Application No. 2017-078826 filed Apr. 12, 2017, the entire contents of each of which are incorporated herein by reference.

BACKGROUND OF THE INVENTION

1. Field of the Invention

One or more embodiments of the present invention relate to a display device and/or an array substrate.

2. Description of the Related Art

An organic electroluminescence (EL) display device has a display panel where a thin film transistor (TFT), an organic light emitting diode (OLED), and the like are formed on a substrate. A display panel like this generates electromagnetic noise, and may trigger, for example, a malfunction of an attached touch panel. With respect to such a problem, for example, in Japanese Patent Application Laid-Open No. 2003-099193, it is suggested to form an ITO film on a substrate of a touch panel part and a substrate of a display panel part.

SUMMARY OF THE INVENTION

However, adverse effects of the electromagnetic noise are expected to be more reliably suppressed.

One or more embodiments of the invention have been made in view of the above, and it is an object thereof to provide an organic EL display device that can more reliably suppress adverse effects of the electromagnetic noise.

A display device according to an embodiment of the present invention includes: a substrate, a plurality of pixels on the substrate, a first inorganic insulating layer that covers the plurality of pixels, a conductive layer on the first inorganic insulating layer, and a second inorganic insulating layer on the conductive layer, the conductive layer being between the first inorganic insulating layer and the second inorganic insulating layer, wherein the first inorganic insulating layer includes an area that is in direct contact with the second inorganic insulating layer, and all of the conductive layer is covered with the first inorganic insulating layer and the second inorganic insulating layer.

A display device according to another embodiment of the present invention includes: a substrate, a plurality of pixels on the substrate, a first inorganic insulating layer that covers the plurality of pixels, and a conductive layer on the first inorganic insulating layer, wherein the first inorganic insulating layer overlaps all of the conductive layer in a plan view.

An array substrate according to another embodiment of the present invention includes: a base substrate, a plurality of pixel electrodes on the base substrate, a first inorganic insulating layer covering the pixel electrodes, a conductive layer on the first inorganic insulating layer, and a second inorganic insulating layer on the conductive layer, the conductive layer being between the first inorganic insulating layer and the second inorganic insulating layer, wherein the first inorganic insulating layer includes an area that is in direct contact with the second inorganic insulating layer, and all of the conductive layer is covered with the first inorganic insulating layer and the second inorganic insulating layer.

BRIEF DESCRIPTION OF THE DRAWINGS

FIG. 4 is a schematic cross sectional view of an example of a state where a touch panel is placed on the display panel illustrated in FIG. 2.

DETAILED DESCRIPTION OF THE INVENTION

Figure 1:
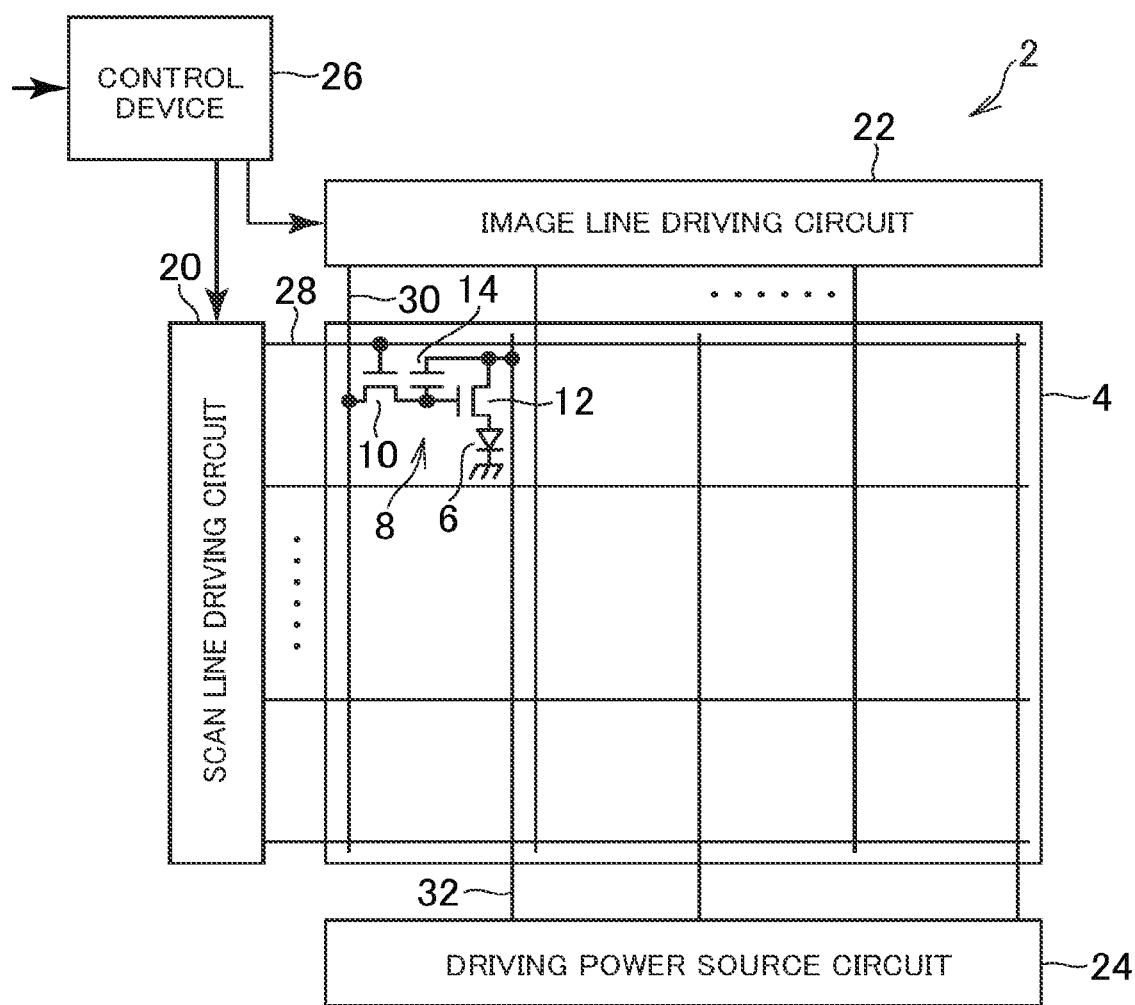
FIG. 1 is a schematic view of a schematic configuration of an organic EL display device according to an embodiment of the present invention.

Below, the respective embodiments of the present invention are explained with reference to the accompanying drawings. Note that the disclosed embodiments are merely examples, and an appropriate variation which a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those which have already been illustrated in another drawing, and a detailed explanation of such elements may be omitted as appropriate.

FIG. 1 is a schematic view of a schematic configuration of an organic EL display device according to an embodiment of the present invention. An organic EL display device 2 is provided with a pixel array part 4 which displays an image, and a driving part which drives the pixel array part 4. The organic EL display device 2 has a display panel where a lamination structure of a TFT, an OLED, and the like is formed on a substrate. Note that the schematic view illustrated in FIG. 1 is an example, and the present embodiment is not limited thereto.

On the pixel array part 4, OLEDs 6 and pixel circuits 8 are arranged in a matrix form, in correspondence with the respective pixels. The pixel circuit 8 is composed of a plurality of TFTs 10 and 12, and a capacitor 14.

The driving part as described above includes a scan line driving circuit 20, an image line driving circuit 22, the driving power source circuit 24, and the control device 26, and drives the pixel circuit 8 to control light emission of the OLED 6.

The scan line driving circuit 20 is connected to a scan signal line 28 provided for each horizontal line of pixels (pixel row). The scan line driving circuit 20 selects scan signal lines 28 in order according to timing signals input from the control device 26, and applies an electric voltage for turning on the lighting TFT 10 to the selected scan signal line 28.

The image line driving circuit 22 is connected to an image signal line 30 provided for each vertical line of pixels (pixel column). The image line driving circuit 22 receives an input of an image signal from the control device 26, and in accordance with a selection of the scan signal line 28 by the scan line driving circuit 20, outputs an electric voltage according to the image signal for the selected pixel row to each image signal line 30. That electric voltage is written into the capacitor 14 via the lighting TFT 10 at the selected pixel row. The driving TFT 12 supplies the OLED 6 with an electric current according to the written electric voltage, and thus the OLED 6 of the pixel which corresponds to the selected scan signal line 28 emits light.

The driving power source circuit 24 is connected to a driving electric power supply line 32 provided for each pixel column, and supplies the OLED 6 with an electric current via the driving electric power supply line 32 and the driving TFT 12 in the selected pixel row.

Here, a lower electrode of the OLED 6 is connected to the driving TFT 12. Whereas, an upper electrode of each OLED 6 is composed of an electrode shared in common by the OLEDs 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, and the upper electrode becomes an anode and a high electric potential is input thereto.

Figure 2:
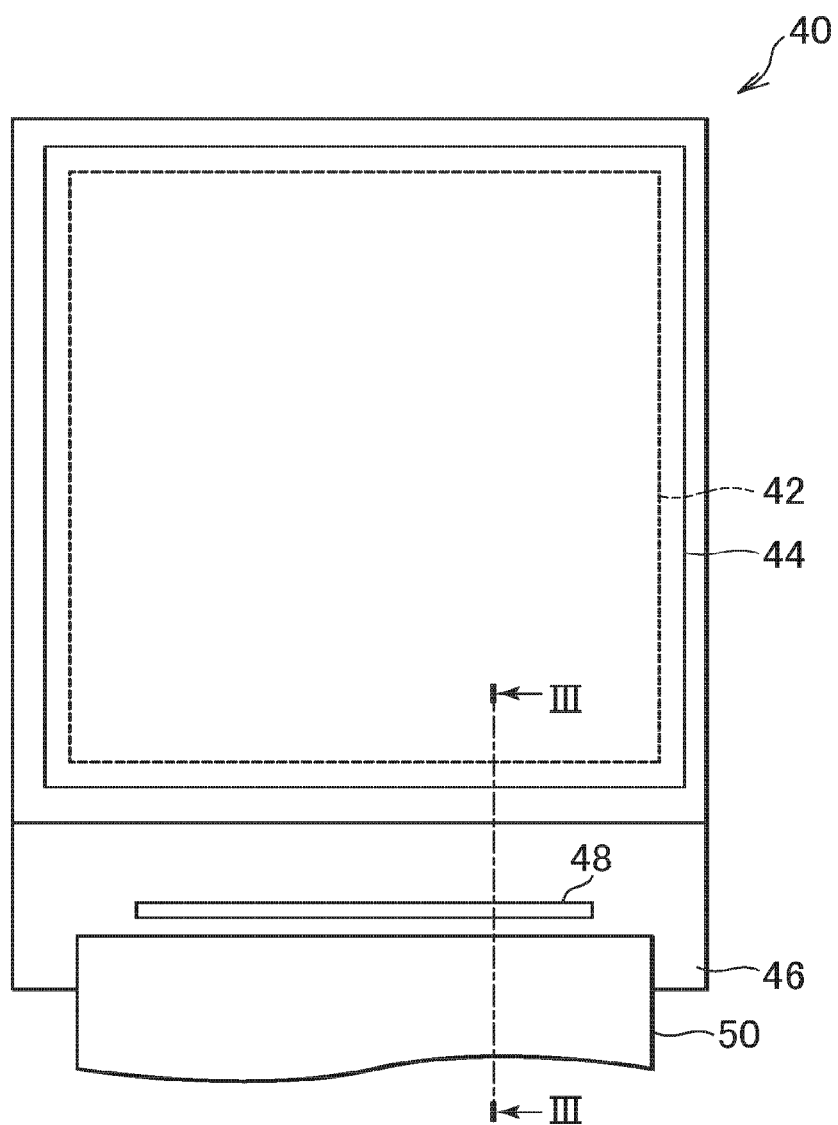
FIG. 2 is a schematic plan view of an example of a display panel of the organic EL display device illustrated in FIG. 1.

FIG. 2 is a schematic plan view of an example of the display panel of the organic display device illustrated in FIG. 1. The pixel array part 4 illustrated in FIG. 1 is provided in a display area 42 of the display panel 40, and as described above the OLEDs are arranged on the pixel array part 4. As described above, an upper electrode 44 which constitutes the OLED 6 is formed so as to be shared in common by the respective pixels and covers the entire display area 42.

On one side of the display panel 40 which has a rectangular shape, a component mounting area 46 is provided, and a wiring connected to the display area 42 is disposed thereon. Further, on the component mounting area 46 a driver integrated circuit (IC) 48 which constitutes the driving part is mounted, and an FPC 50 is connected to the component mounting area 46. The flexible printed circuit (FPC) 50 is connected to the control device 26, and other circuits 20, 22, and 24, and the like, and an IC is mounted on the FPC 50.

Figure 3:
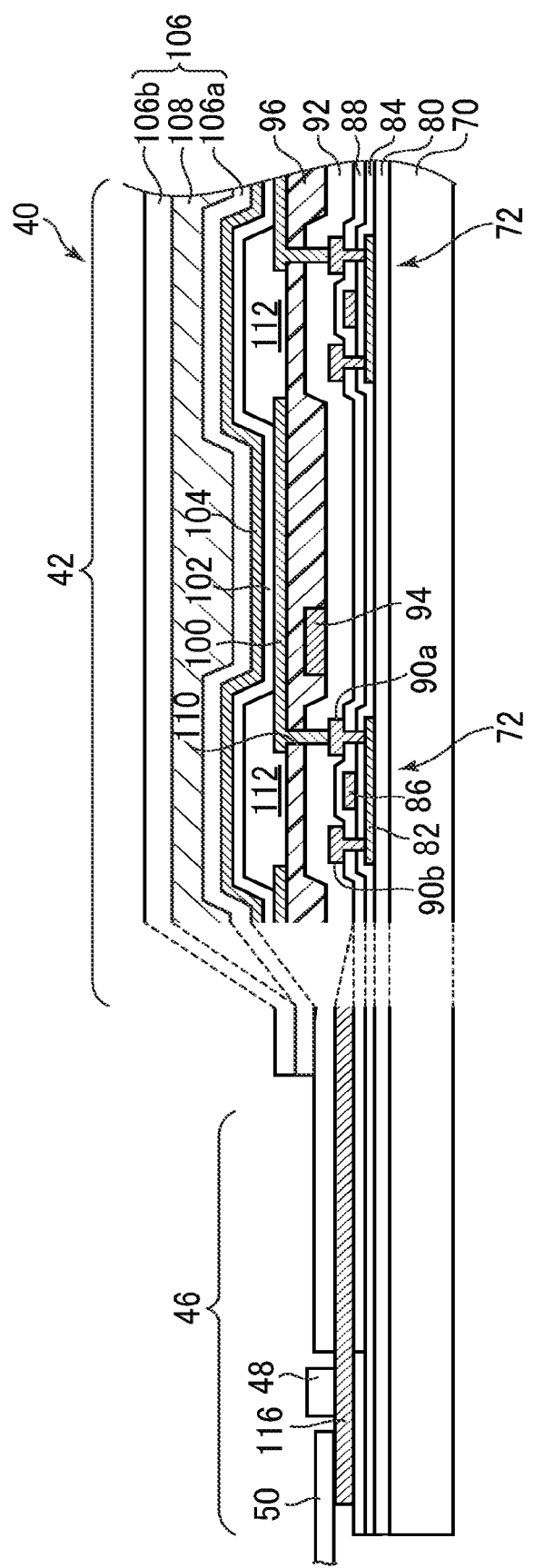
FIG. 3 is a view of an example of cross section of FIG. 2.

FIG. 3 is a view of an example of cross section of FIG. 2. The display panel 40 has a structure where a circuit layer composed of a TFT 72 and the like, the OLED 6, a sealing layer 106 which seals the OLED 6, and the like are laminated on a substrate 70. The substrate 70 is composed of, for example, a glass board, or a resin film such as polyimide resin. In the present embodiment, the pixel array part 4 is a top emission type pixel array, and light generated in the OLED 6 is emitted to a side opposite from the substrate 70 side (in an upper direction in FIG. 3) with respect to the OLED 6. In a case where a colorization method of the organic EL display device 2 is set to the color filter method, the color filter is arranged over the sealing layer 106, for example. By letting white light generated in the OLED 6 go through this color filter, lights in colors such as red (R), green (G), and blue (B) are generated, for example.

On the circuit layer of the display area 42, the pixel circuit 8, the scan signal line 28, the image signal line 30, and the driving electric power supply line 32 which have been described above, and the like are formed. At least a part of the driving part can be formed as a circuit layer in an area adjacent to the display area 42, on the insulating base material 70. As described above, the driver IC 48 and the FPC 50 which constitute the driving part can be connected to a wiring 116 of the circuit layer in the component mounting area 46.

As illustrated in FIG. 3, on the substrate 70, an under-layer 80 which is formed of an inorganic insulating material is arranged. As the inorganic insulating material, for example, silicon nitride ($SiN_y$), silicon oxide ($SiO_x$), or a complex of these is used.

In the display area 42, with an interposition of the under-layer 80, a semiconductor area 82 to be a channel part and the source/drain part of the top gate type TFT 72 is formed on the substrate 70. The semiconductor area 82 is formed of, for example, polysilicon (p-Si). The semiconductor area 82 is formed by, for example, providing a semiconductor layer (a p-Si film) on the substrate 70, patterning this semiconductor layer, and selectively leaving parts which are used in the circuit layer. Over the channel part of the TFT 72, a gate electrode 86 is arranged with an interposition of a gate insulating film 84. The gate insulating film 84 is typically formed of TEOS. The gate electrode 86 is formed by, for example, patterning a metal film formed by sputtering or the like. On the gate electrode 86, an interlayer insulating layer 88 is arranged so as to cover the gate electrode 86. The interlayer insulating layer 88 is formed of, for example, the inorganic insulating material as described above. In the semiconductor area 82 (p-Si) to be the source/drain part of the TFT 72, impurities are introduced by an ion injection, and further a source electrode 90a and a drain electrode 90b which are electrically connected thereto are formed, and thus the TFT 72 is formed.

On the TFT 72, an interlayer insulating film 92 is arranged. On the surface of the interlayer insulating film 92, a wiring 94 is arranged. The wiring 94 is formed by, for example, patterning a metal film formed by sputtering or the like. With a metal film which constitutes the wiring 94, and a metal film which is used to form the gate electrode 86, the source electrode 90a and the drain electrode 90b, for example, the wiring 116, and the scan signal line 28, the image signal line 30, and the driving power supply line 32 which are illustrated in FIG. 1 can be formed as a multilayer wiring structure. Thereon, a planarizing film 96 is formed, for example, of a resin material such as an acrylic resin, and in the display area 42, the OLED 6 is formed on the planarizing film 96.

The OLED 6 includes a lower electrode 100, an organic material layer 102, and an upper electrode 104. The organic material layer 102 includes, specifically, a hole transport layer, a light emitting layer, an electron transport layer, and the like. The OLED 6 is typically formed by laminating the lower electrode 100, the organic material layer 102, and the upper electrode 104 in this order from the substrate 70 side. In the present embodiment, the lower electrode 100 is an anode of the OLED, and the upper electrode 104 is a cathode.

If the TFT 72 illustrated in FIG. 3 is the driving TFT 12 having an n-channel, the lower electrode 100 is connected to the source electrode 90a of the TFT 72. Specifically, after forming the planarizing film 96 as described above, a contact hole 110 for connecting the lower electrode 100 to the TFT 72 is formed, and for example by patterning a conductive body part formed on the surface of the planarizing layer 96 and inside the contact hole 110, the lower electrode 100 connected to the TFT 72 is formed for each pixel.

On the structure as described above, a bank 112 which separates pixels is arranged. For example, after forming the lower electrode 100, the bank 112 is formed on a border of pixels, and in an effective area of a pixel surrounded by the bank 112 (an area where the lower electrode 100 is exposed), the organic material layer 102 and the upper electrode 104 are laminated. The upper electrode 104 is typically formed of a transparent electrode material.

On the upper electrode 104, a sealing layer 106 is arranged. The sealing layer 106 can function as, for example, a protection layer which protects the OLED 6 from moisture and the like, and therefore the sealing layer 106 is formed to cover the whole of the display area 42. Although not shown here, a protection layer can be disposed on the display area 42 so as to ensure mechanical strength of the surface of the display panel 40, for example. In this case, a protection layer is not typically provided on the component mounting area 46 so as to facilitate connection of the IC and the FPC to the component mounting area 46. A wiring of the FPC 50 and a terminal of the driver IC 48 are electrically connected to, for example, the wiring 116.

As a method of installing a touch panel on the display device, a configuration of externally attaching the touch panel to the display panel (out-cell method), a configuration of providing the touch panel outside the display panel (for example, between the display panel and the polarizing plate arranged outside the display panel) and integrating the display panel and the touch panel (on-cell method), and a configuration of providing the touch panel inside the display panel (in-cell method) are known. In the present embodiment, the out-cell method or the on-cell method are adopted. Specifically, as illustrated in FIG. 4, the touch panel 60 is arranged on the sealing layer 106 of the display panel 40, and in this state, the display panel 40 is put inside a housing of the organic EL display device 2. Note that in FIG. 4, as the lamination structure of the display panel 40 illustrated in FIG. 3, a lamination structure from which the sealing layer 106 over the substrate 70 is omitted is illustrated as an upper structure layer 114, in a simplified manner.

The sealing layer 106 includes a first sealing layer 106a, a conductive layer 108, and a second sealing layer 106b in this order from the substrate 70 side. As shown, the conductive layer 108 is not provided on the edge of the sealing layer 106 outside the display area 42, and the first sealing layer 106a is in direct contact with the second sealing layer 106b. The sealing layer 106 includes the conductive layer in this manner, thereby shielding the electromagnetic noise at a position closer to the sources of the noise (display part). This can suppress the adverse effects of electromagnetic noise more reliably. For example, it is possible to more reliably suppress a malfunction of a touch panel. Further, a conductive layer can be formed in the step of forming a sealing layer, and this serves to improve manufacturing efficiency.

The first sealing layer (inorganic insulating layer) 106a and the second sealing layer (inorganic insulating layer) 106b are each formed by, for example, forming a film of inorganic insulating material, such as $SiN_y$, to have a thickness of several μm or so using a chemical vapor deposition (CVD) method. By inserting the conductive layer 108 between such sealing layers, in other words, covering the entire conductive layer 108 with the first sealing layer 106a and the second sealing layer 106b, adverse effects of the conductive layer 108 on the other members can be suppressed. The conductive layer 108 is formed so as to cover the display area 42. The conductive layer 108 is preferably formed such that the sheet resistance is 500Ω per square or less in order to achieve, for example, satisfactory effects of shielding electromagnetic noise generated on the display part (the structure layer 114 below the sealing layer 106). Further, the conductive layer 108 is preferably formed so as to ensure transparency (e.g., having a visible light transmittance of 50% or more).

The conductive layer 108 includes conductive material. For example, following materials are used as the conductive material: metals such as silver, gold, copper, nickel, and alloys of these metals (e.g., Cu—Ni); carbon; metal oxide such as indium tin oxide (ITO); and electroconductive polymer.

The conductive layer 108 includes, for example, a binder resin such as an acrylic resin and the conductive material described above. In this case, the thickness of the conductive layer 108 is 10 μm to 50 μm, for example. The conductive material used in combination with the binder resin may be formed appropriately, although a nanowire (typically, metal nanowire) and/or a nanotube (typically, carbon nanotube) are preferably used. The metal nanowire is particularly preferred between them. The metal nanowire can satisfactorily achieve, for example, the conductivity and transparency described above. Here, the nanowire is a fiber-like conductive substance with a solid structure having a diameter of nanometer size, and the nanotube is a fiber-like conductive substance with a hollow structure having a diameter of nanometer size. Thicknesses of the nanowire and the nanotube are, for example, 5 nm to 500 nm, and are preferably 5 nm to nm. Lengths of the nanowire and the nanotube are, for example, 1 μm to 1000 μm, and are preferably 10 μm to 1000 μm. The conductive layer 108 is formed by, for example, applying an application material containing the binder resin and the conductive material to the first sealing layer 106a (e.g., by using the inkjet method), and subjecting the application material to a post-treatment (e.g., heat curing treatment and light curing treatment) as appropriate according to a type of the binder resin. The conductive layer 108 can also function as a flattening layer of the sealing layer 106.

The present invention is not limited to the embodiments as have been described above, and various kinds of variations are acceptable. For example, the configurations explained as to the above embodiments can be replaced with a configuration which is substantially the same as the ones which have been explained regarding the embodiments described above, a configuration which exhibits the same technical effect, or a configuration which can achieve the same objective. Specifically, the conductive layer 108 may be formed of an ITO film, for example.

It is understood that without departing from the spirit of the present invention, those skilled in the art can arrive at various kinds of variations and modifications, and such variations and modifications belong to the scope of the present invention. For example, each of the embodiments as described above to which addition, deletion, or design change of components, or addition, omission, or condition change of processes is suitably applied by those skilled in the art are also encompassed within the scope of the present invention as long as they fall within the spirit of the present invention.

What is claimed is:
1. A display device, comprising:
   a substrate;
   a plurality of pixels on the substrate;
   a first inorganic insulating layer that covers the plurality of pixels;

a conductive layer on the first inorganic insulating layer; and a second inorganic insulating layer on the conductive layer, the conductive layer being between the first inorganic insulating layer and the second inorganic insulating layer, wherein the first inorganic insulating layer includes an area that is in direct contact with the second inorganic insulating layer, the conductive layer is in direct contact only with the first inorganic insulating layer and the second inorganic insulating layer, the conductive layer covers the plurality of pixels, a part of the conductive layer is positioned outside of the display area, and an edge of the part of the conductive layer is positioned between the edge of the first inorganic insulating layer and the display area.

2. The display device according to claim 1, wherein each of the plurality of pixels includes a lower electrode, a light emitting layer on the lower electrode, and an upper electrode on the light emitting layer, the first inorganic insulating layer is positioned on the upper electrode, and the first inorganic insulating layer and the second inorganic insulating layer are sealing layers that seal the light emitting layer.

3. The display device according to claim 1, further comprising a touch panel, wherein the second inorganic insulating layer is positioned between the touch panel and the conductive layer.

4. The display device according to claim 1, wherein the conductive layer includes a binder resin.

5. The display device according to claim 1, wherein the conductive layer includes a nanowire and/or a nanotube.

6. The display device according to claim 1, wherein the conductive layer includes an ITO.

7. The display device according to claim 1, wherein the conductive layer includes a resin and a conductive material.

8. The display device according to claim 1, wherein sheet resistance of the conductive layer is 500Ω per square or less.

9. The display device according to claim 1, wherein the conductive layer has a visible light transmittance of 50% or more.

10. An array substrate comprising:

a base substrate;

a plurality of pixel electrodes on the base substrate;

a first inorganic insulating layer covering the pixel electrodes;

a conductive layer on the first inorganic insulating layer; and a second inorganic insulating layer on the conductive layer, the conductive layer being between the first inorganic insulating layer and the second inorganic insulating layer, wherein the first inorganic insulating layer includes an area that is in direct contact with the second inorganic insulating layer, the conductive layer is in direct contact only with the first inorganic insulating layer and the second inorganic insulating layer, a display area including the pixel electrodes is positioned on the substrate, a part of the conductive layer is positioned outside of the display area, and an edge of the part of the conductive layer is positioned between the edge of the first inorganic insulating layer and the display area.

11. The array substrate according to claim 10, wherein the conductive layer covers the plurality of pixels.

12. A display device, comprising:

a substrate;

a plurality of pixels on the substrate;

a first inorganic insulating layer that covers the plurality of pixels;

a conductive layer on the first inorganic insulating layer; and a second inorganic insulating layer on the conductive layer, the conductive layer being between the first inorganic insulating layer and the second inorganic insulating layer, wherein the first inorganic insulating layer includes an area that is in direct contact with the second inorganic insulating layer, the conductive layer is in direct contact only with the first inorganic insulating layer and the second inorganic insulating layer, each of the plurality of pixels includes a lower electrode, a light emitting layer on the lower electrode, and an upper electrode on the light emitting layer, the first inorganic insulating layer is positioned on the upper electrode, and the first inorganic insulating layer and the second inorganic insulating layer are sealing layers that seal the light emitting layer.

13. The display device according to claim 12, wherein the conductive layer covers the plurality of pixels.

14. The display device according to claim 12, further comprising a touch panel, wherein the second inorganic insulating layer is positioned between the touch panel and the conductive layer.

15. The display device according to claim 12, wherein the conductive layer includes a binder resin.

16. The display device according to claim 12, wherein the conductive layer includes a nanowire and/or a nanotube.

17. The display device according to claim 12, wherein the conductive layer includes an ITO.

18. The display device according to claim 12, wherein the conductive layer includes a resin and a conductive material.

19. The display device according to claim 12, wherein sheet resistance of the conductive layer is 500Ω per square or less.

20. The display device according to claim 12, wherein the conductive layer has a visible light transmittance of 50% or more.

* * * * *